US012306209B2

(12) United States Patent
Goeke et al.

(10) Patent No.: US 12,306,209 B2
(45) Date of Patent: May 20, 2025

(54) HIGH CURRENT EXTENSION FOR A DUAL-STAGE SOURCE MEASURE UNIT (71) Applicant: Keithley Instruments, LLC, Solon, OH (US)

(72) Inventors: Wayne C. Goeke, Hudson, OH (US); Martin J. Rice, Sagamore Hills, OH (US)

(73) Assignee: Keithley Instruments, LLC, Solon, OH (US)

( * ) Notice: Subject to any disclaimer, the term of this patent is extended or adjusted under 35 U.S.C. 154(b) by 136 days.

(21) Appl. No.: 18/120,197

(22) Filed: Mar. 10, 2023

(65) Prior Publication Data
US 2023/0288448 A1 Sep. 14, 2023

Related U.S. Application Data (60) Provisional application No. 63/319,742, filed on Mar. 14, 2022.

(51) Int. Cl.
G01R 1/067 (2006.01)
G01R 1/20 (2006.01)
H02H 1/06 (2006.01)

(52) U.S. Cl.
CPC ................. *G01R 1/06766* (2013.01)

(58) Field of Classification Search
CPC ...... G01R 19/0092; G01R 1/203; H02H 1/06; H02H 1/063
See application file for complete search history.

(56) References Cited

U.S. PATENT DOCUMENTS

| 7,906,977 | B1 | 3/2011 | Goeke et al. | |
| 7,923,985 | B2 | 4/2011 | Goeke et al. | |
| 9,274,145 | B2 | 3/2016 | Goeke | |
| 9,453,880 | B2 | 9/2016 | Goeke | |
| 9,882,482 | B1* | 1/2018 | Hendry | H02M 3/158 |
| 2014/0347078 | A1* | 11/2014 | Qin | G01R 19/0092 324/713 |
| 2016/0087531 | A1* | 3/2016 | Zhang | H02M 3/1582 323/271 |
| 2016/0301310 | A1* | 10/2016 | Mednik | H02M 1/34 |
| 2016/0380447 | A1* | 12/2016 | Kadirvel | H01M 10/441 320/112 |
| 2018/0367045 | A1* | 12/2018 | Zhang | H02M 3/33523 |

* cited by examiner

Primary Examiner — Jermele M Hollington
Assistant Examiner — Temilade S Rhodes-Vivour
(74) Attorney, Agent, or Firm — Miller Nash LLP; Andrew J. Harrington; Krista Y. Chan (57) ABSTRACT A source measure unit has a voltage output stage to provide a voltage across first and second output terminals to connect to a load, and a current output stage to provide a voltage to a first sense resistor, the source measure unit to switchably employ both the voltage output stage and the current output stage for a first range of output current, to regulate a common point, and either output voltage or output current, or employ only one of either the voltage output stage or the current output stage to provide voltage to both the first and second output terminals and a second sense resistor for a second range of output current, and to regulate either output voltage or output current.

20 Claims, 8 Drawing Sheets

HIGH CURRENT EXTENSION FOR A DUAL-STAGE SOURCE MEASURE UNIT

CROSS-REFERENCE TO RELATED APPLICATIONS

This disclosure claims benefit of U.S. Provisional Application No. 63/319,742, titled "HIGH CURRENT EXTENSION FOR A DUAL-STAGE SOURCE MEASURE UNIT," filed on Mar. 14, 2022, the disclosure of which is incorporated herein by reference in its entirety.

TECHNICAL FIELD

This disclosure relates to test and measurement instruments, and more particularly to a source measure unit (SMU).

BACKGROUND

Figure 1:
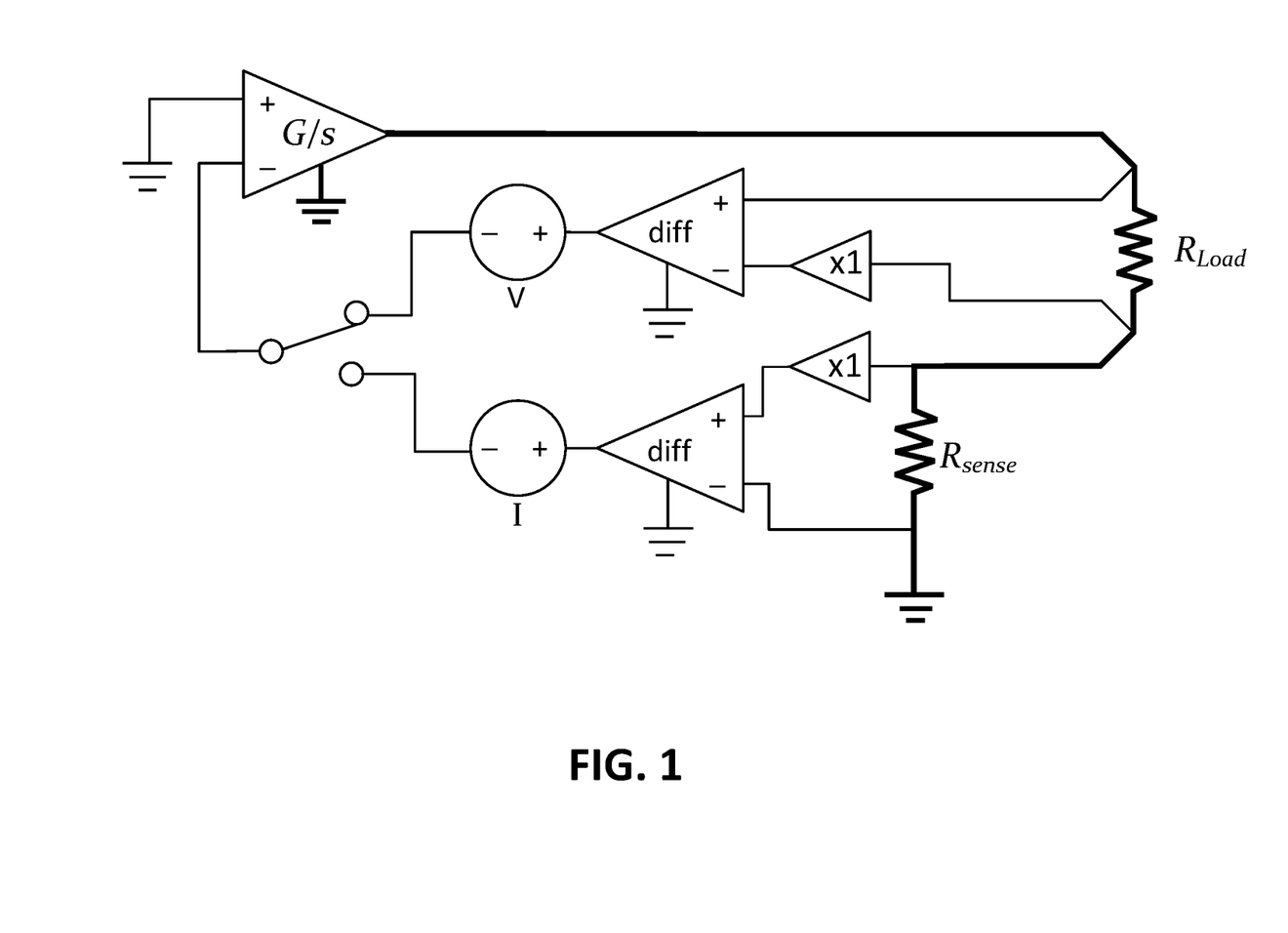
FIG. 1 shows a single output stage source measure unit.

A source measure unit is an instrument that provides a sourcing function for sourcing a voltage and/or a current to a device under test (DUT), and a measurement function to measure a resulting voltage and/or current, simultaneously on the same pin or connector. Generally, two types of SMU topologies exist. FIG. 1 shows the first type, a single output stage design. The output stage delivers the voltage across the load and the sense resistor, $R_{sense}$. The load in many cases comprises a device under test (DUT), and the dimensions, including resistance, of the load are unknown. The sense resistor allows the SMU to be used to measure or force current.

Figure 2:
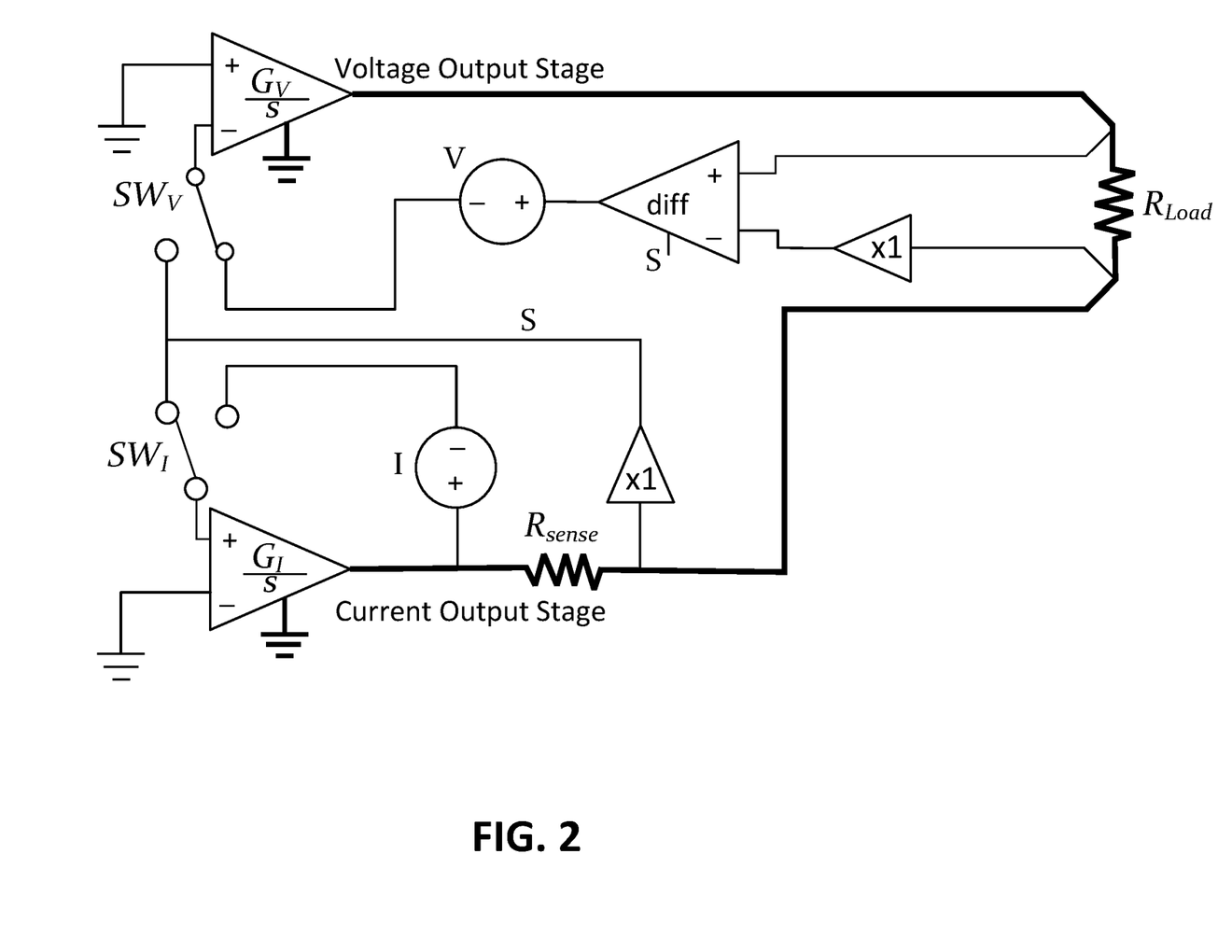
FIG. 2 shows a dual output stage source measure unit.

FIG. 2 shows the second type that has a dual output stage design in which one stage delivers the voltage across the sense resistor, which is measured as current, I, by V/R. A second output stage delivers the voltage across the load. The path in bold shows the current path. The dual stage design has several advantages, as discussed in U.S. Pat. No. 7,906,977, the contents of which are hereby incorporated by reference in their entirety. As shown in FIG. 2, the switches $SW_V$ and $SW_I$ in their current configuration causes voltage across the load resistor. When the switches flip to their other positions, the lower stage delivers voltage across the sense resistor, measurable at the node to the left side of the sense resistor.

The dual stage design does have one drawback. Assuming linear stages, both stages require voltage overhead. As the current delivered to the load increases, the amount of power dissipated in the extra output stage can become significant and challenging to the power supply and heat management of the design. Embodiments of the disclosure address this power dissipation issue, as well as other shortcomings of the prior art.

Embodiments of the disclosure generally provide a hybrid of both a dual stage and a single stage SMU.

DESCRIPTION

As used herein, the voltage sources, such as those shown in FIGS. 1 and 2, represent voltage offsets in the circuit. These act as a means to set the voltage in variable voltage sources to force current in one direction. Adjustable voltage sources place these offsets in the feedback loops that include the differential amplifiers. The switch selects which feedback loop, the voltage stage or the current stage, the loop forces a voltage on either the load or sense resistor.

Figure 3A:
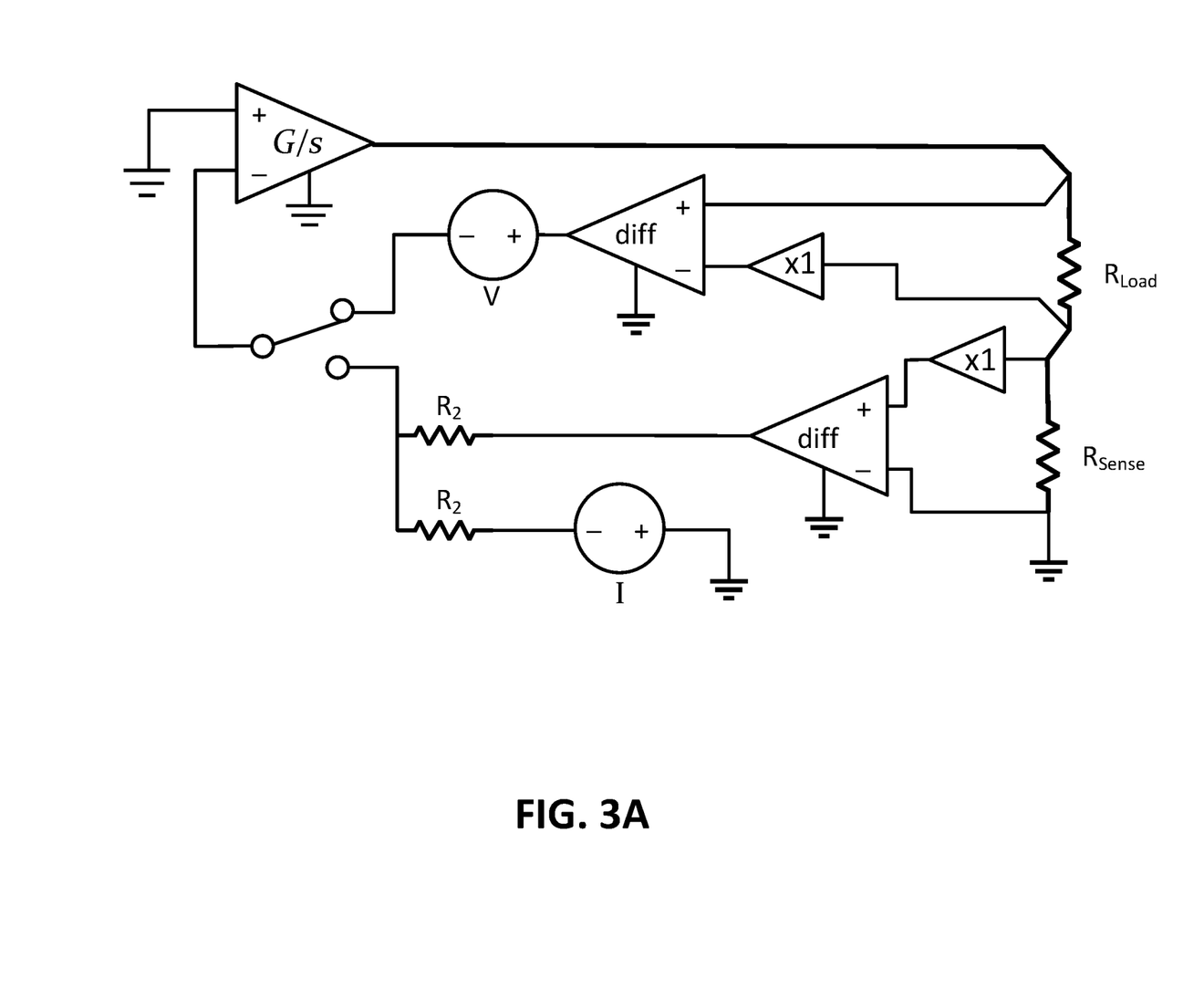
FIGS. 3A, 3B, 3C, and 3D show different embodiments of voltage offsets.

FIGS. 3A-3D show modifications of the feedback loops as examples. In FIG. 3A, the current stage feedback loop is modified to produce its offset by driving $R_1$ with a voltage source, such as a digital-to-analog converter (DAC). The use of a DAC has an advantage in that it has a programmable voltage level that a controller can set. When the switch connects this feedback loop into the overall circuit loop, the circuit loop drives a voltage onto $R_2$, and $R_{sense}$, to cancel the offset.

Figure 3B:
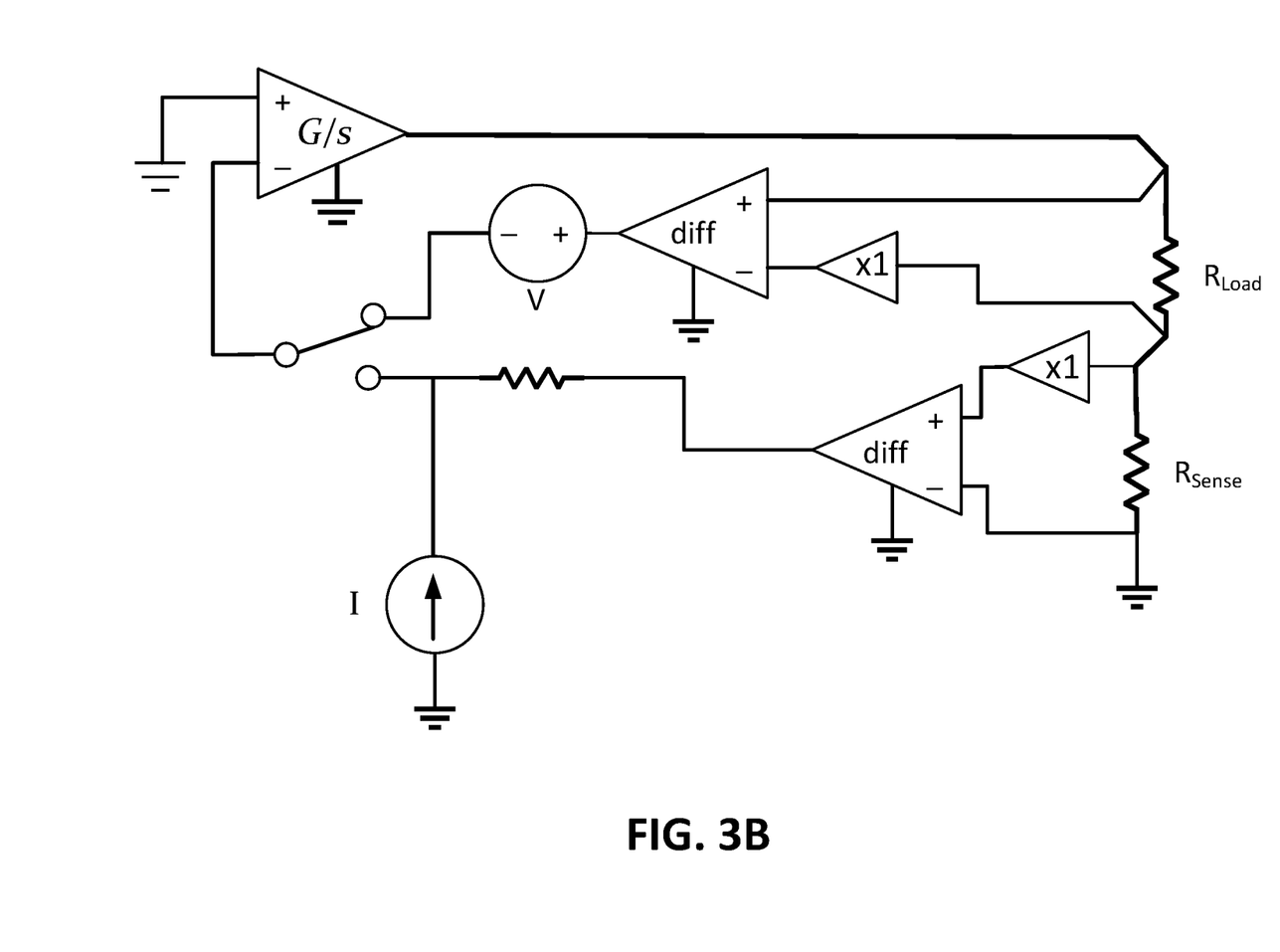
Figure 3C:
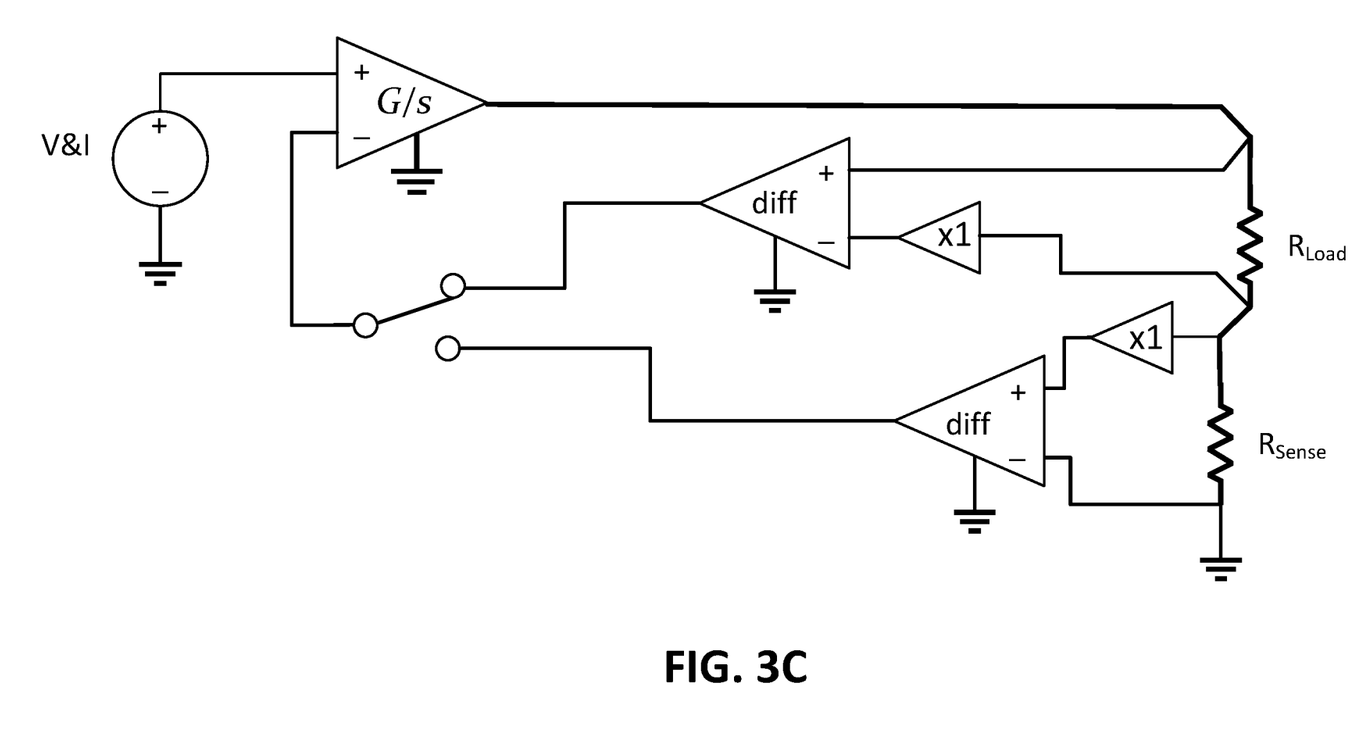
Figure 3D:
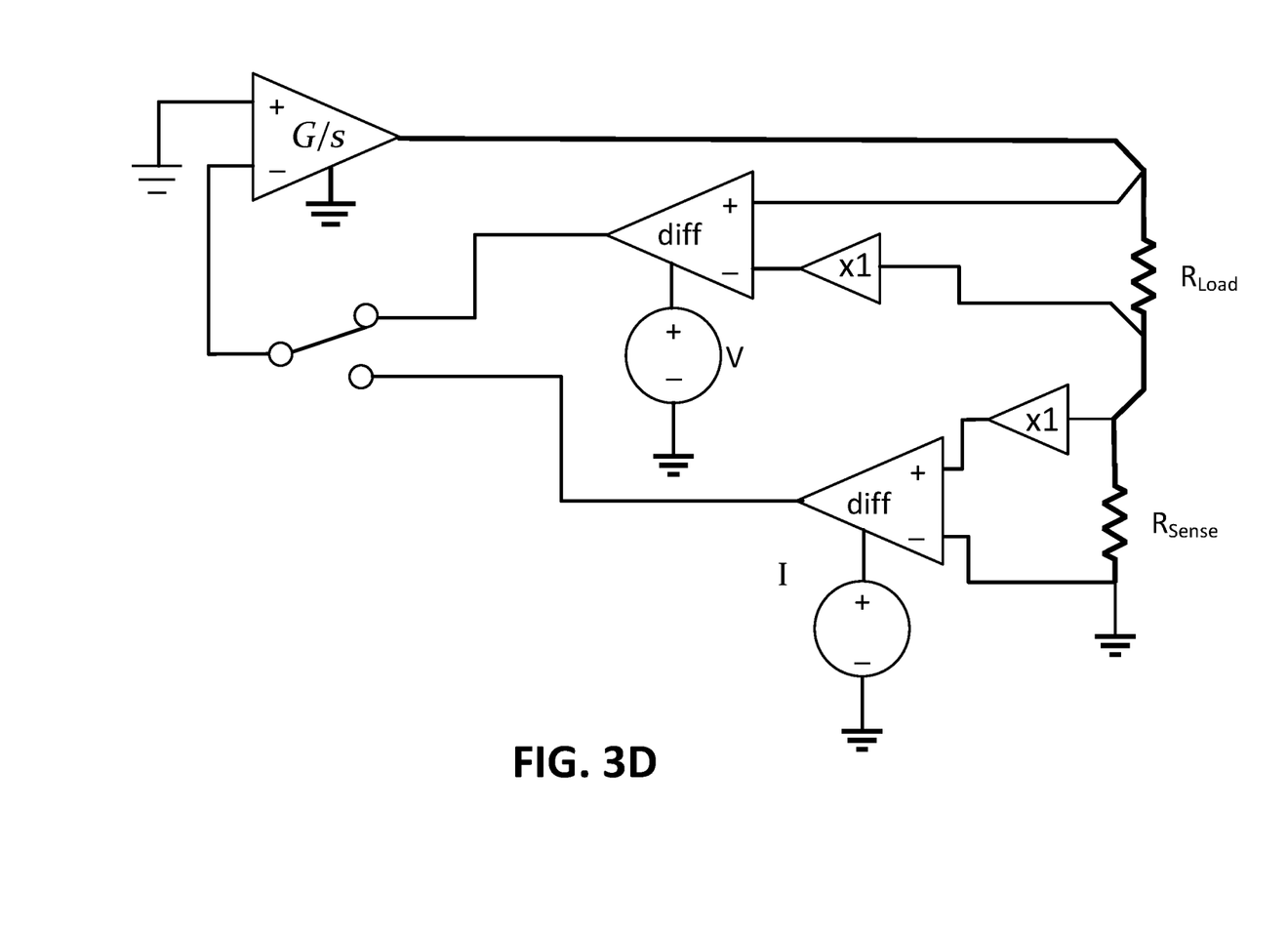

In FIG. 3B, the current feedback offset results from injection of current. When the current stage feedback loop connects to the overall circuit loop, the loop drives a voltage onto the sense resistor to cancel the offset. In FIG. 3C, the offset is produced on the error amplifier. The offset value needs to change when the switch toggles from the voltage feedback to the current feedback for the overall circuit loop. In FIG. 3D, voltage sources, such as DACs, drive the reference nodes of the differential amplifiers to produce the offsets in the feedback loops.

Figure 4:
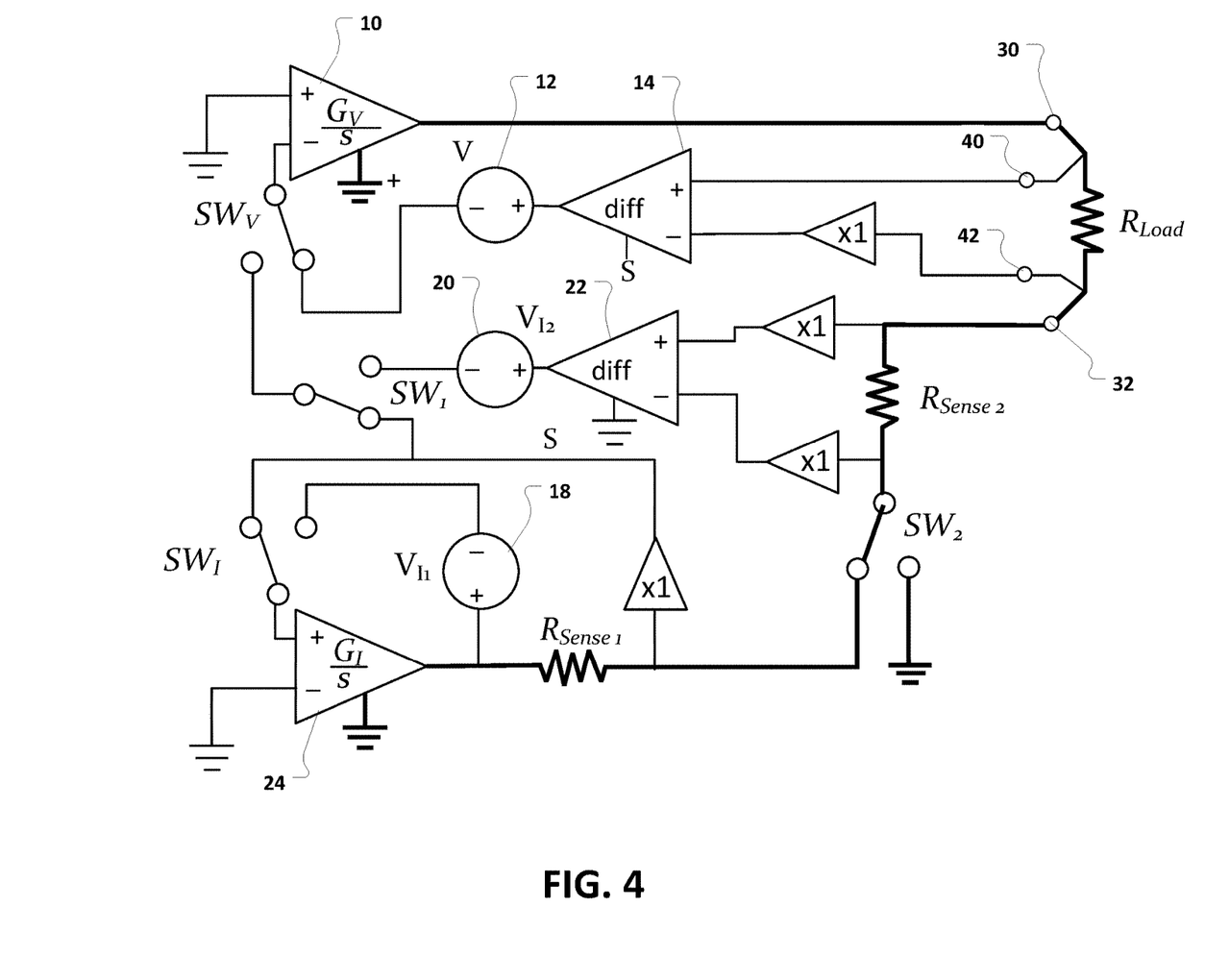
FIG. 4 shows a source measure unit that can switch between operating a dual output stage SMU or a single output stage SMU.

With the understanding, then, that the voltage state and current stages have these offsets, the discussion turns to the overall circuit loop of a dual-stage SMU with a high current adjustment. FIG. 4 shows an SMU that can switch between operating as a dual stage SMU for a first current range, or as a single stage SMU for a second current range. The voltage output stage comprises an operational amplifier 10 and an offset voltage 12. To differentiate between the different components, this discussion will refer to these components as the voltage stage components. The current output stage comprises an operational amplifier 24 and an offset voltage 18. This discussion may refer to the offset voltage 18 as a first current range voltage offset. The second voltage 20 is neither a part of the current output stage nor the voltage output stage, but it operates on the current stage amplifier 24. The first differential amplifier 14 has its inputs connected across the load, $R_{Load}$. The load here typically consists of a device under test (DUT), whose resistance is not known. Amplifier 22 operates when $R_{sense2}$ is being used, discussed in more detail below.

For purposes of this discussion, the second current range will be assumed to be higher than the first current range. The first and second current ranges may also each comprise a plurality of ranges, where the ranges depend upon the size of the resistors. While generally this situation triggers the change from dual stage to single stage, one could configure the circuit to act in an opposite manner. Similarly, for ease of discussion and understanding, the discussion will use the voltage output stage as the operating stage when the circuit operates on the second current range. The use of these particular conditions is intended for ease of understanding and to simplify the discussion, and is not intended to limit the operation or configuration of the circuit to these particular conditions. No such limitation is intended, nor should it be implied.

In normal operation, for example when the current is in a lower range, the circuit operates as a dual stage SMU. With the switches $SW_1$ and $SW_2$ as shown, the circuit operates as a dual stage source measure unit, and the components that operate in the high current range are dormant. The circuit operates as in the circuit of FIG. 2. When the stage switches $SW_V$ and $SW_I$ are as shown in FIG. 4, the SMU forces voltage (V) across first and second source terminals 30 and 32 connected across the load. Terminals 40 and 42 are sense terminals. The amplifier 10 puts V-S across the load while amplifier 24 drives S to be zero (virtual ground). Amplifiers 10 and 20, working together, force V across the load. The point "S" may also be referred to as the common point.

If one were to switch the switches $SW_V$ and $SW_I$ to their other positions, the SMU forces current through the load. The voltage stage amplifier operates to put the right side of the sense resistor, $R_{sense1}$, to 0 (virtual ground) and the left side of the resistor has a voltage, which translates to a current as $I=V_{I1}/R_{Sense1}$.

With the high current range switches $SW_1$ and $SW_2$ in their positions shown, the circuit operates as a dual stage source measure unit. When the circuit begins to operate at a high current range, the designation of which will be discussed briefly later, the switches $SW_1$ and $SW_2$ flip to their opposite states. The current path now goes to ground at switch $SW_2$, and $SW_1$ directs the signal representing the voltage across $R_{Sense2}$ to $SW_V$ via differential amplifier 22. The circuit operates as in the circuit of FIG. 1. The SMU forces voltage across the load while $SW_V$ is in the state shown. Switching $SW_V$ to its opposite state results in the SMU forcing current through the load. The reference or common point, S, for the differential stage 14 needs to be zero for the SMU to force voltage correctly. If $SW_1$ remains as shown, amplifier 24 will drive S to zero as needed. However, there are many other means to force the reference input on 14 to be zero. The load current now only flows through amplifier 10, thus removing amplifier 24 from the path. That SMU is working as a single stage SMU as shown in FIG. 1. The change to $SW_1$ changes the feedback when outputting current from the common point to be from the voltage across the second sense resistor.

The determination of the operating range of the current may occur in several ways. In one embodiment, the user determines that the current range will be higher than the 'normal' current range of the circuit and will preset the current range switches $SW_1$ and $SW_2$ to cause the circuit to operate as a single stage SMU. The user may set the switches through a setting on the SMU. Alternatively, a controller may monitor the current and when higher current range is detected, the controller changes the switches. In yet another alternative, analog circuity may receive the current and as it gets higher ultimately causes the switches to change. An example of this type of auto-ranging circuity can be found in U.S. Pat. No. 7,923,985. This provides merely one example of an auto-ranging current circuit, many other types are also possible.

Figure 5:
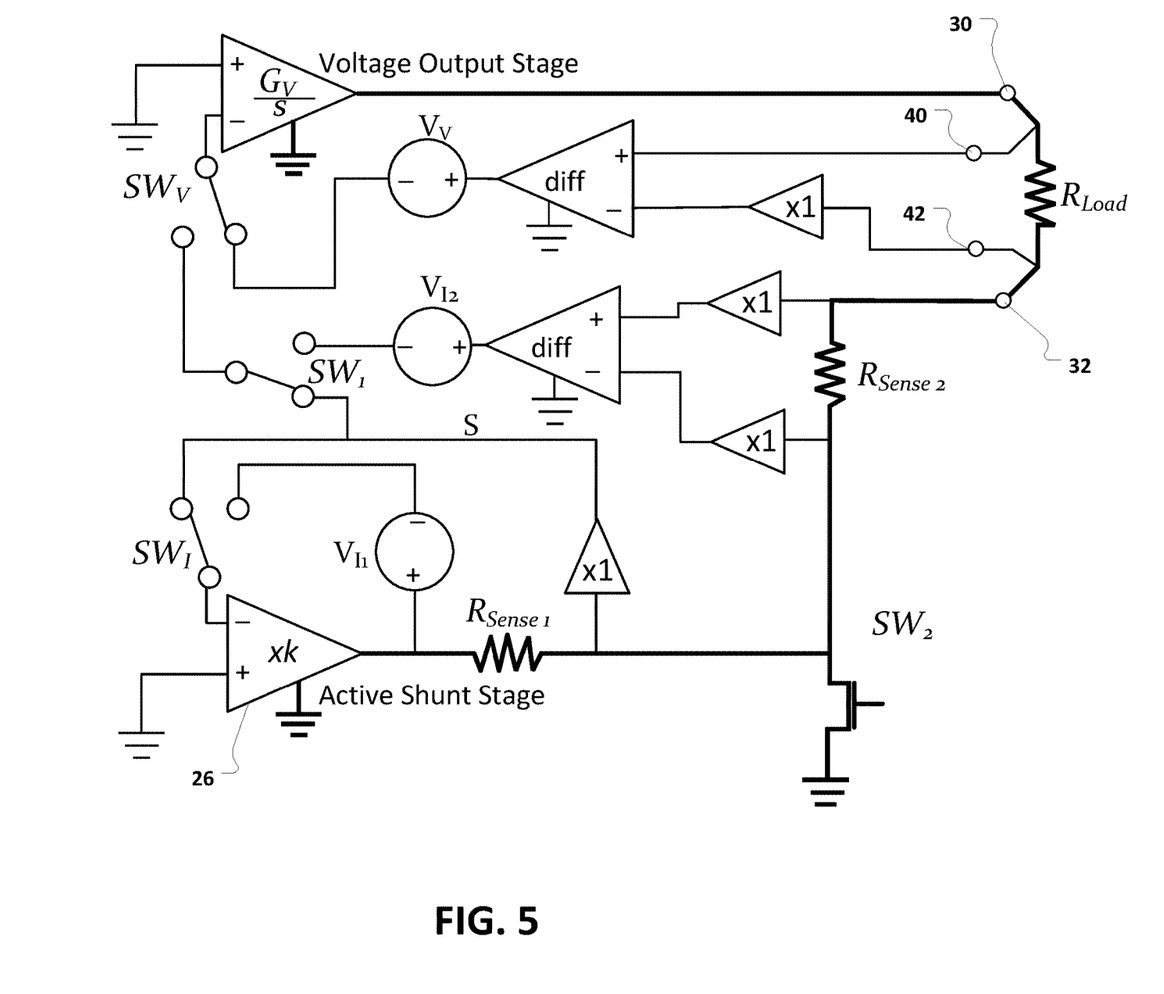
FIG. 5 shows a source measure unit that can switch between operating a dual output stage SMU or a single output stage SMU with a high current shunt.

In FIG. 4, the current stage amplifier 24 essentially acts as an ammeter, allowing the current to be measured while sourcing zero volts, S. FIG. 5 illustrates an alternative embodiment of the disclosure, in which the ammeter present in the embodiment of FIG. 4 is replaced by an active shunt. The active shunt sources a voltage equal to the voltage across $R_{Sense1}$ divided by the gain of amplifier 26, k. The switch $SW_2$ takes the form of a MOSFET transistor, as shown, or could comprise diodes or other switchable components. The active shunt presents a burden voltage allowing the MOSFET to conduct current to ground. The MOSFET acts as a controllable resistance, turning on to a level as needed to conduct the current to ground. The active shunt may be an active shunt as described in U.S. Pat. Nos. 9,274,145 and 9,453,880, the contents of each of which are hereby incorporated by reference into this disclosure. The operational amplifier 24 from FIG. 4 would be a reduced gain amplifier 26 as shown in FIG. 5.

The source measure unit of FIGS. 4 and 5 is configured to flow load current through either both the output stages or a single output stage in a switchable fashion. The switchable fashion may be provided by a pair of switches that can operate to a first switch to connect a second sense resistor to the amplifier in whichever output stage is operating as the single output stage, and a second switch to switch a current path from one side of the second sense resistor to ground. The switchable nature of the connections allows for the circuit to reconfigure itself based upon the current range in which it operates.

Aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable, or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a source measure unit, comprising: a voltage output stage structured to provide a voltage across first and second output terminals for connecting to a load; and a current output stage structured to provide a voltage to a first sense resistor, the source measure unit switchably configured to either employ both the voltage output stage and the current output stage for a first range of output current, to regulate a common point and either output voltage or output current, or employ only one of either the voltage output stage or the current output stage to provide voltage to both the first and second output terminals and a second sense resistor for a second range of output current different than the first range, and to regulate either output voltage or output current.

Example 2 is the source measure unit of Example 1, wherein the voltage output stage is connected to the first output terminal and the second output terminal is connected to a first end of second sense resistor, a second end of the second sense resistor is switchably connected to one of either ground or one end of the first sense resistor, and the current output stage is connected to the other end of the first sense resistor.

Example 3 is the source measure unit of either Examples 1 or 2, wherein the voltage output stage is connected to the first output terminal and the second output terminal is connected to one end of the second sense resistor, a second end of the second sense resistor is connected to one end of the first sense resistor and is connected through controllable resistance to ground, and the other end of the first sense resistor is connected to the current output stage.

Example 4 is the source measure unit of any of Examples 1 through 3, wherein a feedback of the common point is switched to sense voltage across the second sense resistor.

Example 5 is the source measure unit of any of Examples 1 through 4, wherein the first current range is comprised of a plurality of ranges.

Example 6 is the source measure unit of any of Examples 1 through 5, wherein the second current range is comprised of a plurality of ranges.

Example 7 is the source measure unit of any of Examples 1 through 6, further comprising switches that in first positions configure the source measure unit to employ the voltage output stage and the current output stage, and in second positions configure the source measure unit to employ only one of the voltage output stage and the current output stage.

Example 8 is the source measure unit of any of Examples 1 through 6, wherein the switches comprise a first switch that switchably connects a signal from the second sense resistor to an operational amplifier in the voltage output stage, and a second switch that switches a current path from the second sense resistor to ground.

Example 9 is the source measure unit of Example 8, wherein the second switch comprises a switch with a controllable resistance.

Example 10 is the source measure unit of any of Examples 1 through 9, wherein one of the voltage output stage and the current output stage has its gain reduced.

Example 11 is the source measure unit of any of Examples 1 through 10, wherein the switches are configured either prior to operation of the source measure unit or in response to an auto-ranging circuit.

Example 12 is the source measure unit of any of Examples 1 through 11, wherein the source measurement unit is configured to only employ the voltage output stage for the second range of current.

Example 13 is the source measure unit of any of Examples 1 through 12, wherein the second range of current is higher than the first range of current.

Example 14 is a source measure unit, comprising: a voltage output stage having a voltage stage operational amplifier, a voltage stage voltage offset connected to the voltage stage operational amplifier, and output terminals to allow a load to be connected to the output of the voltage stage operational amplifier; a first differential amplifier having sensing terminals as inputs to sense input terminals to allow connection across the load; a current output stage having a current stage amplifier, a first current stage voltage offset switchably connected to the current stage amplifier, and a first sense resistor connected to an output of the current stage operational amplifier; a second differential amplifier having inputs connected across a second sense resistor; a second current stage voltage offset connected to an output of the second differential amplifier switchably connected to the voltage stage operational amplifier, the source measure unit configured to employ either both the voltage output stage and the current output stage for a first range of output current, or only employ the voltage output stage for a second range of current.

Example 15 is the source measure unit of Example 14, wherein one input of the second differential amplifier is switchable to connect to ground and the second current stage voltage offset is switchable to connect to the voltage stage operational amplifier.

Example 16 is the source measure unit of either Examples 14 or 15, wherein the second range of current is higher than the first range of current.

Example 17 is the source measure unit of any of Examples 14 through 16, wherein the current stage amplifier comprises a limited gain amplifier and the second sense resistor is connected to ground by a controllable resistance.

Example 18 is a method of operating a source measure unit having a voltage output stage coupled to a load, and a current output stage coupled to a sense resistor, comprising: determining whether a selected output current level is within a first range or a second range; automatically configuring the source measure unit to use both the voltage output stage and the current output stage, when the selected output current level is within the first range; and automatically configuring the source measure unit to use only one of the voltage output stage and the current output stage when the selected output current level is within the second range.

Example 19 is the method of Example 18, wherein the second range is higher than the first range.

Example 20 is the method of either Examples 18 or 19, wherein automatically configuring the source measure unit comprises one of either automatically configuring the source measure unit based upon predetermined first and second ranges, or using an auto-ranging circuit.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A source measure unit, comprising:
   a voltage output stage structured to provide a voltage across first and second output terminals for connecting to a load; and
   a current output stage structured to output a voltage to a first sense resistor,
   the source measure unit switchably configured to either employ both the voltage output stage and the current output stage for a first range of output current, to regulate a common point and either output voltage or output current, or employ only one of either the voltage output stage or the current output stage to provide voltage to both the first and second output terminals and a second sense resistor for a second range of output current different than the first range, and to regulate either output voltage or output current.

2. The source measure unit as claimed in claim 1, wherein the voltage output stage is connected to the first output terminal and the second output terminal is connected to a first end of second sense resistor, a second end of the second sense resistor is switchably connected to one of either ground or one end of the first sense resistor, and the current output stage is connected to another end of the first sense resistor.

3. The source measure unit as claimed in claim 1, wherein the voltage output stage is connected to the first output terminal and the second output terminal is connected to one end of the second sense resistor, a second end of the second sense resistor is connected to one end of the first sense resistor and is connected through controllable resistance to ground, and another end of the first sense resistor is connected to the current output stage.

4. The source measure unit as claimed in claim 1, wherein a feedback of the common point is switched to sense voltage across the second sense resistor.

5. The source measure unit as claimed in claim 1, wherein the first range of output current is comprised of a plurality of ranges.

6. The source measure unit as claimed in claim 1, wherein the second range of output current is comprised of a plurality of ranges.

7. The source measure unit as claimed in claim 1, further comprising switches that in first positions configure the source measure unit to employ the voltage output stage and the current output stage, and in second positions configure the source measure unit to employ only one of the voltage output stage and the current output stage.

8. The source measure unit as claimed in claim 7, wherein the switches comprise a first switch that switchably connects a signal from the second sense resistor to an operational amplifier in the voltage output stage, and a second switch that switches a current path from the second sense resistor to ground.

9. The source measure unit as claimed in claim 8, wherein the second switch comprises a switch with a controllable resistance.

10. The source measure unit as claimed in claim 1, wherein one of the voltage output stage and the current output stage has its gain reduced.

11. The source measure unit of claim 7, wherein the switches are configured either prior to operation of the source measure unit or in response to an auto-ranging circuit.

12. The source measure unit of claim 1, wherein the source measurement unit is configured to only employ the voltage output stage for the second range of current.

13. The source measure unit of claim 1, wherein the second range of current is higher than the first range of current.

14. A source measure unit, comprising:
    a voltage output stage having a voltage stage operational amplifier, a voltage stage voltage offset connected to the voltage stage operational amplifier, and output terminals to allow a load to be connected to an output of the voltage stage operational amplifier;
    a first differential amplifier having sensing terminals as inputs to sense input terminals to allow connection across the load;
    a current output stage having a current stage amplifier, a first current stage voltage offset switchably connected to the current stage amplifier, and a first sense resistor connected to an output of the current stage amplifier;
    a second differential amplifier having inputs connected across a second sense resistor; and
    a second current stage voltage offset connected to an output of the second differential amplifier switchably connected to the voltage stage operational amplifier,
    the source measure unit configured to employ either both the voltage output stage and the current output stage for a first range of output current, or only employ the voltage output stage for a second range of current.

15. The source measure unit as claimed in claim 14, wherein one input of the second differential amplifier is switchable to connect to ground and the second current stage voltage offset is switchable to connect to the voltage stage operational amplifier.

16. The source measure unit as claimed in claim 14, wherein the second range of current is higher than the first range of current.

17. The source measure unit as claimed in claim 14, wherein the current stage amplifier comprises a limited gain amplifier and the second sense resistor is connected to ground by a controllable resistance.

18. A method of operating a source measure unit having a voltage output stage coupled to a load, and a current output stage having an output coupled to a sense resistor, comprising:
- determining whether a selected output current level is within a first range or a second range;
- automatically configuring the source measure unit to use both the voltage output stage and the current output stage, when the selected output current level is within the first range; and
- automatically configuring the source measure unit to use only one of the voltage output stage and the current output stage when the selected output current level is within the second range.

19. The method as claimed in claim 18, wherein the second range is higher than the first range.

20. The method as claimed in claim 18, wherein automatically configuring the source measure unit comprises one of either automatically configuring the source measure unit based upon predetermined first and second ranges, or using an auto-ranging circuit.

* * * * *